Dec. 9, 1958

F. W. SCHMIDT

CRYSTAL OSCILLATOR AND BUFFER AMPLIFIER CIRCUITS OR THE LIKE

Filed Nov. 14, 1955

2,863,956

FRED W. SCHMIDT

*INVENTOR.*

BY [signature]

HIS ATTORNEY

United States Patent Office 2,863,956

Patented Dec. 9, 1958

2,863,956

CRYSTAL OSCILLATOR AND BUFFER AMPLIFIER CIRCUITS OR THE LIKE

Fred W. Schmidt, Whittier, Calif., assignor to Hoffman Electronics Corporation, a corporation of California Application November 14, 1955, Serial No. 546,667

2 Claims. (Cl. 179—171)

This invention is related to selectively variable oscillator circuits providing an output signal of constant amplitude for all excursions of operating frequency, and more particularly to a new and improved oscillator and buffer amplifier circuit exhibiting a uniform output signal level for all operating frequencies.

In the past, many types of oscillator circuits have been devised which exhibit a substantially linear output signal level for all operating frequencies. Unfortunately, this does not hold true for many types of oscillator circuits employing a selectable crystal regenerative feedback circuit together with a resonant circuit of constant frequency since, in such circuits, if the oscillator frequency is shifted away from the frequency of the resonant circuit by virtue of the selection of a crystal of different frequency in the feedback circuit, the regeneration afforded by the crystal will be reduced, by virtue of the oscillator operating on the skirt of the resonant circuit selectivity curve. It would of course be desirable to devise a new and useful oscillator or oscillator and buffer amplifier circuit which will exhibit an output signal of constant amplitude for all frequencies of operation.

Therefore, it is an object of the present invention to provide a new and useful crystal oscillator and buffer amplifier circuit which will exhibit constant gain for all operating frequencies.

It is a further object of the present invention to provide a new and useful selectable crystal oscillator and buffer amplifier circuit which will be of relatively simple design and yet maintain substantially linear output signal characteristics.

According to the present invention, a class C operated crystal oscillator having an R–C feedback circuit to the control electrode is cathode coupled, for example, to a succeeding buffer amplifier stage such as a triode grounded grid amplifier. The oscillator circuit is provided with a broadband, low Q resonant circuit which is aligned at the frequency of the highest frequency crystal to be employed in the feedback circuit, or to a multiple of the frequency thereof. As the gain of the oscillator drops in the presence of selected reductions in crystal frequency of the feedback circuit, the interwire and interelectrode capacitances of the succeeding amplifier stage increase the input impedance of the amplifier stage. But more important, the cathode bias reference level of the buffer amplifier, owing to the cathode coupling, is reduced, thereby raising the amplification factor of the buffer amplifier tube. These effects combine to increase the gain of the amplifier, thereby compensating for the decrease in gain of the oscillator during periods of reduction of the oscillator operating frequency from the frequency of its resonant circuit.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figure 1:
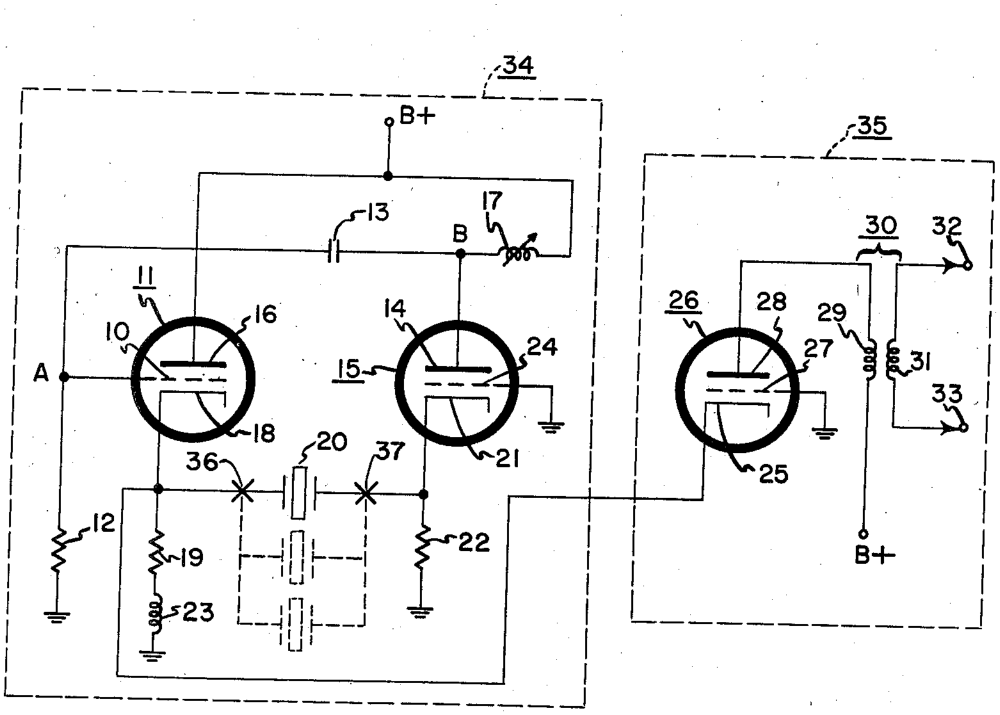
Figure 1 is a schematic diagram of a crystal oscillator and buffer amplifier circuit according to the present invention.

In Figure 1, control electrode 10 of vacuum tube 11 is coupled through resistor 12 to ground and also through capacitor 13 to anode 14 of vacuum tube 15. Anode 16 of vacuum tube 11 is coupled to a source of positive potential (for instance B+), as is also anode 14 of vacuum tube 15 through alignment inductor 17. Cathode 18 of vacuum tube 11 is coupled through cathode impedance or resistor 19 and through inductor 23 to ground, and also through crystal 20 to cathode 21 of vacuum tube 15. Cathode 21 is coupled through cathode impedance or resistor 22 to ground. Control electrode 24 of vacuum tube 15 is maintained at ground potential. Cathode 25 of vacuum tube 26 is directly connected to cathode 18 of vacuum tube 11. Control electrode 27 is maintained at ground potential as shown. Anode 28 is coupled through primary winding 29 of output transformer 30 to a source of positive potential (B+). Secondary winding 31 of transformer 30 is directly connected to output terminals 32 and 33. Tube stage 34 including vacuum tube 11 is a crystal oscillator employing a crystal regenerative feedback circuit between cathodes 18 and 21 of vacuum tubes 11 and 15, respectively. Tube stage 35 is a buffer amplifier which is cathode coupled to oscillator 34. The particular type of oscillator contemplated by the present invention is that which requires no tuning, save for the insertion of a selected crystal in the feedback circuit, by a crystal turret for example, through the cooperation of switch contacts 36 and 37.

The operation of the circuit of Figure 1 is as follows. Vacuum tube 15 and the circuitry associated therewith are similar to a conventional grounded grid amplifier with the output thereof coupled through capacitor 13 to the input side of vacuum tube 11. Vacuum tube 11 and the circuitry associated therewith constitute a conventional cathode follower. The anode circuit of the grounded grid amplifier which includes vacuum tube 15 is parallel resonant (by virtue of the inclusion of inductor 17, capacitor 13, and the anode-to-control electrode and anode-to-ground capacitances of tube 15), is broadbanded by virtue of the inclusion of resistor 12 and the impedance (assumed to be low) of the power source, and may be aligned at the high end of the frequency range by the appropriate adjustment of variable inductor 17. Other types of low Q broadband circuits may of course be employed. That the circuits including capacitor 13 and inductor 17 may be tuned is illustrated by the fact that anode 14 is coupled to R–F ground through both of the reactance branches. Tube stage 35 also is or may be a grounded grid amplifier stage which is cathode coupled to oscillator 34. Inductor 23 may simply comprise a choke coil so as to increase the cathode impedances of vacuum tubes 11 and 26. Crystal 20 couples a regenerative feedback voltage to the input of vacuum tube 15, by virtue of the relative absence of phase shift across control electrode 10 and cathode 18 of cathode follower stage 11 and the 180° phase shift across crystal 20.

The crystal oscillator circuit 34 of Figure 1, an integral portion of the present invention, has proven very useful in a variety of instances since, merely by switching in an appropriate crystal in the feedback circuit, the output signal frequency is changed. Oscillator 34 may of course be used as a doubler or tripler in which the tuned circuit of the oscillator is a chosen multiple of the crystal frequency. When crystals having lower frequencies are switched into oscillator circuit 34, the gain of the output signal at cathode 21 is reduced since the oscillator will be operating on the skirt of the resonant circuit selectivity curve. This is indicated by line or curve 200 in Figure 2. Or, looking at it another way, as the frequency of the oscillator is made to increase, by virtue of the inclusion of a crystal of higher frequency in the feedback circuit, the gain of stage 34 also increases. But as the gain of the oscillator is reduced the grid leak bias level of tube 11 will also be reduced, thus increasing the mu of the buffer amplifier tube and the signal voltage developed across the common cathode impedance of tubes 11 and 26. This increased signal voltage drives buffer amplifier 35 to produce an output voltage of increased magnitude at terminals 32 and 33. This consequential gain stabilization is aided by the effect of the interelectrode and interwire capacitance of tube stage 35 since, as the oscillator signal frequency increases, the capacitive reactance of the control electrode to cathode combination is reduced, thus shunting out a fraction of the input signal to ground. Hence, the gain of tube stage 35 is increased for reductions in frequency of operation of oscillator 34. This combined effect is illustrated by curve 201 in Figure 2, which appertains to grounded grid amplifier 35. That the variable mu phenomenon of the cathode driven buffer amplifier is the greater of the two effects aforementioned is illustrated by the fact, found experimentally to be true, that substitution of crystals of various Q's in the oscillator feedback circuit in no wise affects the level of the output signal of the system.

Figure 2:
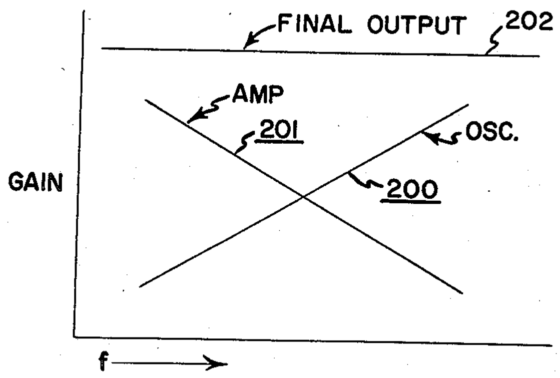
Figure 2 is a graphical representation of the gain versus frequency characteristics of the oscillator and amplifier of Figure 1, showing with particularity the compensating effects of the amplifier upon oscillator operation.

Again, adding the effects of the frequency-gain characteristics of oscillator 34 and amplifier 35, it is seen that the gain of the output signal at terminals 32 and 33 will be substantially linear for all operating frequencies, as is indicated by line 202 in Figure 2. Thus, one will achieve a signal at output terminals 32 and 33 which will be of constant amplitude, despite the switching in of additional and varied frequency crystals between switch contacts 36 and 37 in oscillator tube stage 34. This is believed to be a distinct advantage over the prior art.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. In combination, first, second and third vacuum tubes each having anode, cathode and control electrodes; a first resistor coupled between said control electrode of said first tube and a common reference potential; a first capacitor coupled between said anode of said second tube and said control electrode of said first tube; said anode of said first tube being coupled to a source of potential which is positive with respect to said common reference potential; a conductive path including a resistive impedance between said cathode of said first tube and said common reference potential; an impedance coupled between said cathode of said second tube and said common reference potential; said control electrodes of said second and third tubes being coupled to said common reference potential; said cathode of said third tube being directly coupled to said cathode of said first tube; a plurality of crystals resonant at different predetermined frequencies of a band of frequencies, switch means coupled between said cathodes of said first and second tubes for selectable individual insertion of said crystals between said cathodes; a low-Q parallel resonant circuit including an inductor coupled between said anode of said second tube and said positive potential source, said resonant circuit being resonant at the highest of said different frequencies and having a bandwidth which includes the lowest of said different frequencies; and an output circuit coupled to said anode of said third tube.

2. In combination, first, second and third vacuum tubes each having anode, cathode and control electrodes; a first resistor coupled between said control electrode of said first tube and a common reference potential; a first capacitor coupled between said anode of said second tube and said control electrode of said first tube; said anode of said first tube being coupled to a source of potential which is positive with respect to said common reference potential; a conductive path including a resistive impedance between said cathode of said first tube and said common reference potential; an impedance coupled between said cathode of said second tube and said common reference potential; said control electrodes of said second and third tubes being coupled to said common reference potential; said cathode of said third tube being directly coupled to said cathode of said first tube; a plurality of crystals resonant at different predetermined frequencies of a band of frequencies, switch means coupled between said cathodes of said first and second tubes for selectable individual insertion of said crystals between said cathodes; a low-Q parallel resonant circuit including an inductor coupled between said anode of said second tube and said positive potential source, said inductor being tunable to resonate said circuit at the highest of said different frequencies, said circuit then having a bandwidth which includes the lowest of said different frequencies; and an output circuit coupled to said anode of said third tube.

References Cited in the file of this patent

UNITED STATES PATENTS

| | | |
|---|---|---|
| 1,485,156 | Arnold | Feb. 26, 1924 |
| 2,472,598 | Loughlin | June 7, 1949 |
| 2,702,837 | Easton | Feb. 22, 1955 |

OTHER REFERENCES

"Handbook of Piezoelectric Crystals for Radio Equipment Designers," John P. Buchanan, Philco Corp., December 1954, pages 244–252. See Fig. 1–173 of page 246. WADC Technical Report 54–248. (Copy in Class II.)